United States Patent
Shigehiro

[11] Patent Number: 6,104,619
[45] Date of Patent: Aug. 15, 2000

[54] TAPE CARRIER PACKAGE AND ITS FABRICATION METHOD THEREFOR

[75] Inventor: Koji Shigehiro, Tokyo, Japan

[73] Assignee: Kabushiki Kaisha Toshiba, Kawasaki, Japan

[21] Appl. No.: 09/210,803

[22] Filed: Dec. 15, 1998

[30] Foreign Application Priority Data

Dec. 16, 1997 [JP] Japan .................................. 9-346574

[51] Int. Cl.$^7$ ................................................. H05K 7/02
[52] U.S. Cl. .................. 361/749; 361/748; 361/751; 361/760; 361/762; 257/668; 257/690; 257/734; 257/735; 349/150
[58] Field of Search .................................... 361/749, 748, 361/751, 760, 762, 767, 772, 764; 257/668, 690, 734, 735, 736, 737, 780; 349/150

[56] References Cited

U.S. PATENT DOCUMENTS

| | | | |
|---|---|---|---|
| 5,569,964 | 10/1996 | Ikebe ...................................... | 257/780 |
| 5,614,760 | 3/1997 | Osono et al. ............................ | 257/668 |
| 5,659,198 | 8/1997 | Okutomo et al. ....................... | 257/659 |
| 5,726,491 | 3/1998 | Tajima et al. ........................... | 257/668 |
| 5,821,614 | 10/1998 | Hashimoto et al. .................... | 257/679 |
| 5,841,188 | 11/1998 | Murasawa .............................. | 257/668 |
| 5,844,307 | 12/1998 | Suzuki et al. ........................... | 257/690 |
| 5,952,717 | 9/1999 | Taniguchi et al. ....................... | 257/734 |
| 5,963,287 | 10/1999 | Asada et al. ............................ | 349/150 |
| 5,977,617 | 11/1999 | Kata ........................................ | 257/668 |

*Primary Examiner*—Leo P. Picard
*Assistant Examiner*—David Foster
*Attorney, Agent, or Firm*—Oblon, Spivak, McClelland, Maier & Neustadt, P.C.

[57] ABSTRACT

A tape carrier package (TCP) and method of fabricating a tape carrier package (TCP) are provided to reduce a width dimension in a slim tape carrier package (TCP) used in a flat-panel display apparatus, such as a liquid crystal display (LCD) apparatus. While some margin in width is necessary for absorbing the spreading of potting resin that seals a driver integrated circuit (IC), the spreading is limited within a narrow area by providing a configuration that is formed of an insulating film on a flexible insulating board. An insulating-film-omission region for not arranging an insulating film is installed within a band of the insulating film for covering a group of wirings on the insulated film board and is arranged to surround the mounting region of the driver integrated circuit (IC). The insulating-film-omission region serves for storing the sealing resin, while an inner edge of the band of the insulating film serves as a levee for preventing the sealing resin from wetting and spreading.

10 Claims, 4 Drawing Sheets

TAPE CARRIER PACKAGE AND ITS FABRICATION METHOD THEREFOR

BACKGROUND OF THE INVENTION

1. Field of the Invention

The present invention relates to a tape carrier package (TCP) mounted on a flat-panel display apparatus, for example, a liquid crystal display apparatus. Particularly, the present invention relates to a tape carrier package of a slim type (slender type) capable of narrowing the non-image-displaying peripheral region in a liquid crystal display apparatus used in a notebook personal computer (PC), a car navigation system, such as a global positioning system (GPS), a small-sized television (TV) set and so on.

2. Description of the Related Art

In recent years, a flat-panel display apparatus substituting for a cathode ray tube (CRT) display has been intensively developed. Particularly, a liquid crystal display apparatus can achieve thin dimensions, light weight and low power consumption. Therefore, the market has rapidly been expanded starting the from use of the notebook PC's. With respect to a liquid crystal display apparatus, narrowing of the peripheral region has been expedited to further promote the advantage of saving space. For this purpose, the shape or mounting of the tape carrier package (TCP) or a driver printed circuit board (PCB), which are arranged at peripheral edges of a display panel, has been devised. As one example, in recent years, "a slim tape carrier package (TCP)" having a slim driver integrated circuit (IC) has been fabricated and used.

An explanation will be given of a conventional slim tape carrier package (TCP) in reference to FIGS. 3 and 4.

FIG. 3 is a schematic cross-sectional and perspective view viewing a slim tape carrier package (TCP) 100 from a face arranged with metal wiring. Further, FIG. 4 is a cross-sectional and perspective view similar to FIG. 3 showing a state of the tape carrier package (TCP) 100 before sealing is carried out by a potting resin 102.

The tape carrier package (TCP) 100 is fabricated substantially by the following steps (1) through (4).

(1) Fabrication of a Board Attached with Terminals and Wirings

An insulated film board 103, having a slender and substantially rectangular shape, is installed so as to have slits 131 for the terminals (i.e., for a group of input terminals and a group of output terminals). The slits 131 are located at end portions of the terminals and along the two long sides of the terminals. The insulated film board 103 is also installed with a slit 132 for an integrated circuit (IC) for mounting a driver integrated circuit (IC) 104 substantially at a central portion thereof.

The slits 131 for the terminals are arranged so that the group of the outside input terminals and the group of the outside output terminals both are comprised of metal foils, while a group of wirings 105 for the driver integrated circuit (IC), which group of wirings 105 reach from the groups 151 of input and output terminals to the slit 132, are formed on the insulated film board 103. Further, lead portions 152 extend from the group of wirings 105 into the slit 132 for the integrated circuit (IC).

(2) Formation of an Insulating Film (solder resist)

An insulating film 106 is formed to cover an entire region where the group of wirings 105 are formed on the insulated film board 103 (refer to FIG. 4). The insulating film 106 also covers portions 165 along short sides of the insulated film board 103 which are normally regions where the group of wirings 105 are not formed. By the portions 165, the insulating film 106 surrounds the slit 132 for the integrated circuit (IC) (refer to FIG. 4).

(3) Mounting of the Driver Integrated Circuit (IC)

The driver integrated circuit (IC) 104 is fitted into the slit 132 for the integrated circuit (IC). Then, bumps 141 of the driver integrated circuit (IC) and the lead portions 152 from the group of wirings 105 are connected by an Au/Sn eutectic bonding or similar (state of FIG. 4).

(4) Sealing by the Potting Resin

The potting resin 102 is poured into, and heated and cured, at a region of the bumps 141 of the driver integrated circuit (IC) and their surroundings (state of FIG. 3).

The tape carrier package (TCP) fabricated as described above is mounted and connected to pads located at an edge portion of a display panel.

The following problem is posed in the above-described conventional technology.

A considerably large deviation occurs in the width of wetting and spreading the potting resin for sealing the driver integrated circuit (IC). Accordingly, a dimension for the width D from the driver integrated circuit (IC) to the slit for the terminal needs to be set to include a margin for absorbing the deviation. Therefore, a total width of the slim tape carrier package (TCP) is increased by an amount of the margin.

When an amount of the potting resin 102 is reduced in order to reduce the wetting and spreading width, the reliability of sealing the driver integrated circuit (IC) 104 is deteriorated. Meanwhile, when the margin for absorbing the deviation is reduced, the potting resin 102 may partially cover the terminal metal foil and the reliability of terminal connection is deteriorated.

Although the slim driver integrated circuit (IC) is created by an enormous effort of technical development, the width of the tape carrier package (TCP) cannot be reduced to a degree of narrowing the driver integrated circuit (IC) because of the problem of sealing the driver integrated circuit (IC).

SUMMARY OF THE INVENTION

The present invention has been carried out in view of the above-described problem. The present invention is aimed at providing a tape carrier package (TCP) and a method of fabricating a tape carrier package (TCP) for a flat-panel display apparatus, such as a liquid crystal display apparatus, which is capable of restricting the width of wetting and spreading a potting resin for sealing a driver integrated circuit (IC) so that a width dimension can further be reduced.

According to an aspect of the present invention, a tape carrier package (TCP) is provided which comprises: a flexible insulating board; a driver integrated circuit (IC), substantially in a rectangular shape, arranged on the flexible insulating board, and including a group of terminals for providing an output signal by controlling an input signal with a predetermined timing; a group of wirings, which are electrically connected to the group of terminals of the driver integrated circuit (IC) and which extend to the outer sides of the flexible insulating board; an insulating film pattern arranged on the group of wirings to surround the driver integrated circuit (IC) at a distance from the driver integrated circuit (IC) and having a step or stepped portion along the driver integrated circuit (IC); and a sealing resin for sealing the group of terminals of the driver integrated circuit (IC) and a region between the insulating film pattern and the group of the terminals of the driver integrated circuit (IC).

By the above-described constitution, the integrated circuit (IC) sealing resin, before being cured, can be prevented from spreading to the outer sides. Therefore, a dimension of the tape carrier package (TCP), in particular, a dimension thereof in the width direction, can significantly be reduced. Further, the number of manufacturing steps or the amount of burden in the manufacturing steps is not increased by reducing the width of the tape carrier package (TCP).

According to another aspect of the present invention, a method of fabricating a tape carrier package (TCP) is provided which includes mounting a driver integrated circuit (IC), substantially in a rectangular shape, having a group of terminals for providing an output signal by controlling an input signal with a predetermined timing, onto a flexible insulating board having a certain flexibility, the method comprising the steps of: forming a group of wirings electrically connected to the group of terminals of the driver integrated circuit (IC) and extended to outer sides of the flexible insulating board; forming an insulating film on the group of wirings; and sealing the group of terminals of the driver integrated circuit (IC) by a sealing resin. The method further comprises a step of installing a raised portion or a stepped portion serving as a levee or a weir for the sealing resin before being cured, in a region where the group of wirings are formed, prior to the step of sealing.

By the above-described constitution, the integrated circuit (IC) sealing resin, before being cured, can be prevented from spreading to outside input and output terminals, by which the width of the tape carrier package (TCP) (i.e., a dimension of the tape carrier package (TCP) in a width direction of the driver integrated circuit (IC)) can significantly be reduced.

DETAILED DESCRIPTION OF THE PREFERRED EMBODIMENT(S)

An explanation will be given of an embodiment of the invention in reference to FIGS. 1 and 2.

Figure 1:
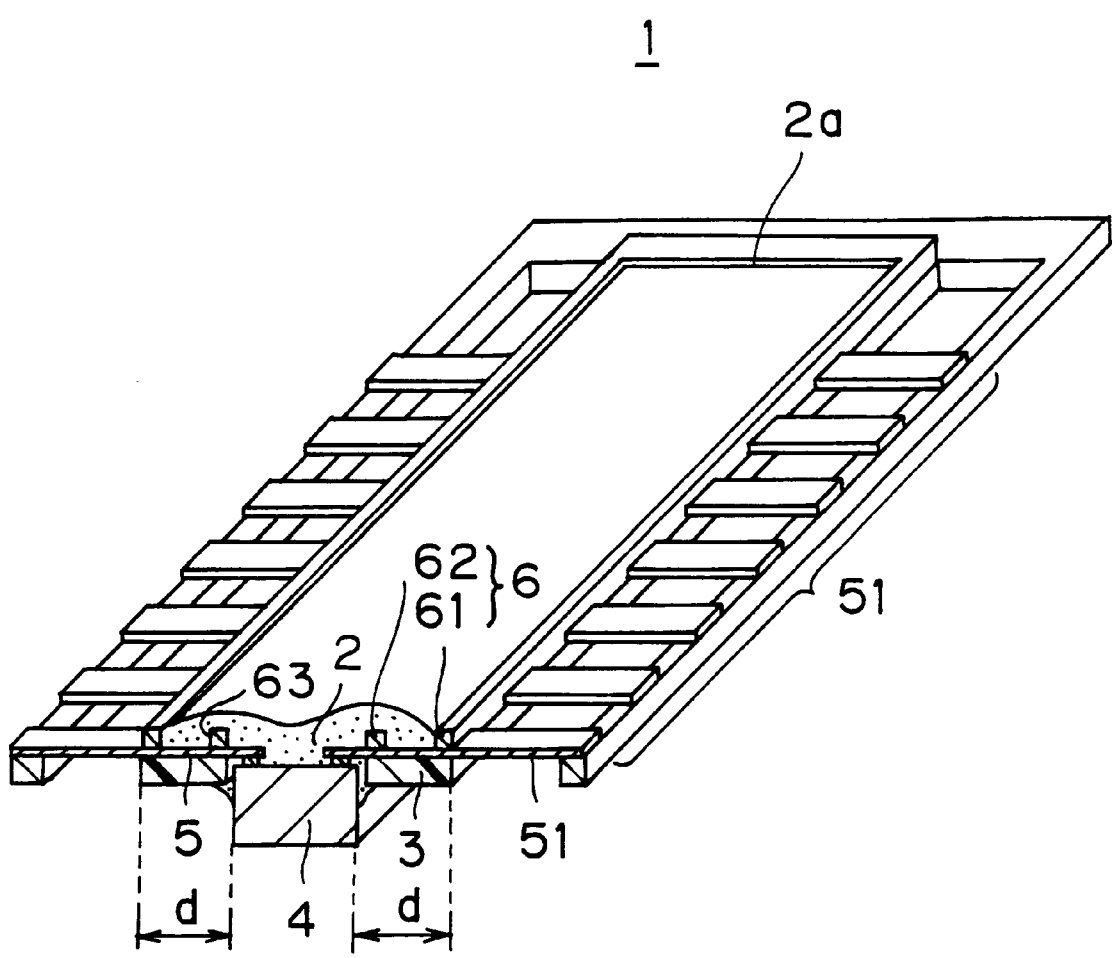
FIG. 1 is a schematic cross-sectional and perspective view viewing a slim tape carrier package (TCP) from a wiring face side according to a first embodiment.

FIG. 1 is a cross-sectional and perspective view viewing a slim tape carrier package (TCP) 1 from a wiring face side (side of face arranged with metal wiring). Further, FIG. 2 is a cross-sectional and perspective view similar to FIG. 1 showing a state of the tape carrier package (TCP) 1 before carrying out sealing by a potting resin 2.

The slim tape carrier package (TCP) 1 is fabricated by the following steps (1) through (4).

(1) Fabrication of a Board Attached with Terminals and Wirings

A polyimide film board 3 having a slender and substantially rectangular shape is installed with slits 31 for terminals respectively for a group of input terminals and a group of output terminals at end portions along the two long sides of the rectangular shape and is installed with a slit 32 for mounting a driver integrated circuit (IC} 4 substantially at a central portion thereof. In other words, the above-described slits 31 for terminals may be omitted when connection between the group of input terminals or the group of output terminals with outside terminals is carried out by an anisotropic conductive film (ACF). If the tape carrier package (TCP) 1 is mounted on the apparatus by folding an intermediary between the group of input terminals or the group of output terminals and the driver integrated circuit (IC) 4, slits for folding are formed in correspondence with the folded structure.

The group of outside input terminals and the group of outside output terminals 51 both comprising copper foils are arranged at the slits 31 for terminals. A group of wirings 5 reaching from the group of outside input and output terminals 51 to the slit 32 for integrated circuit (IC) are formed on the polyimide film board 3. Further, leads 52 are extended from the group of wirings 5 to inside of the slit 32 for the integrated circuit (IC).

(2) Formation of an Insulating Film (solder resist)

Figure 2:
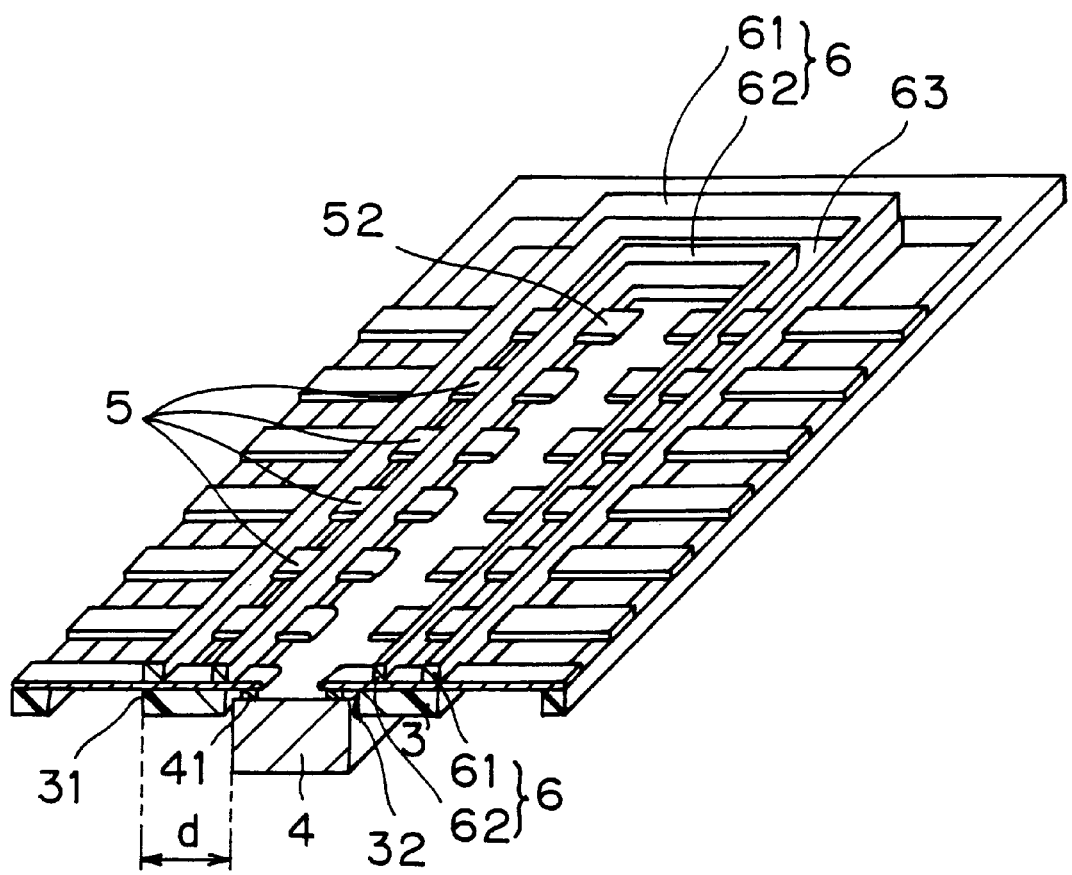
FIG. 2 is a cross-sectional and perspective view similar to FIG. 1 showing a state before carrying out sealing by a potting resin with respect to the slim tape carrier package (TCP) of the first embodiment.
Figure 3:
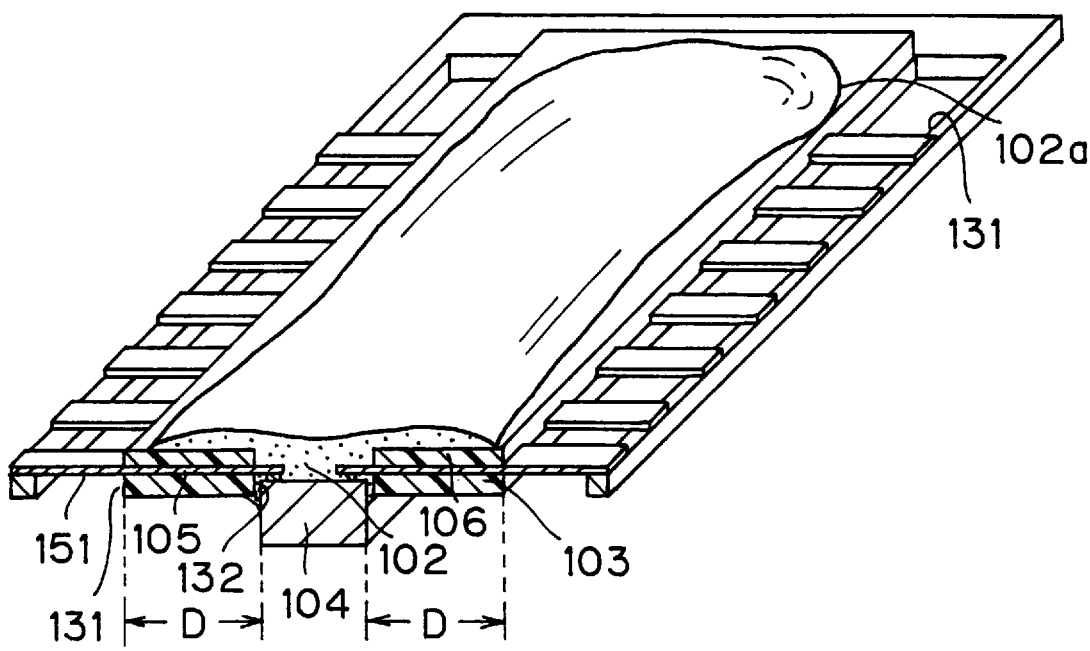
FIG. 3 is a schematic cross-sectional and perspective view viewing a conventional slim tape carrier package (TCP) from a wiring face side.
Figure 4:
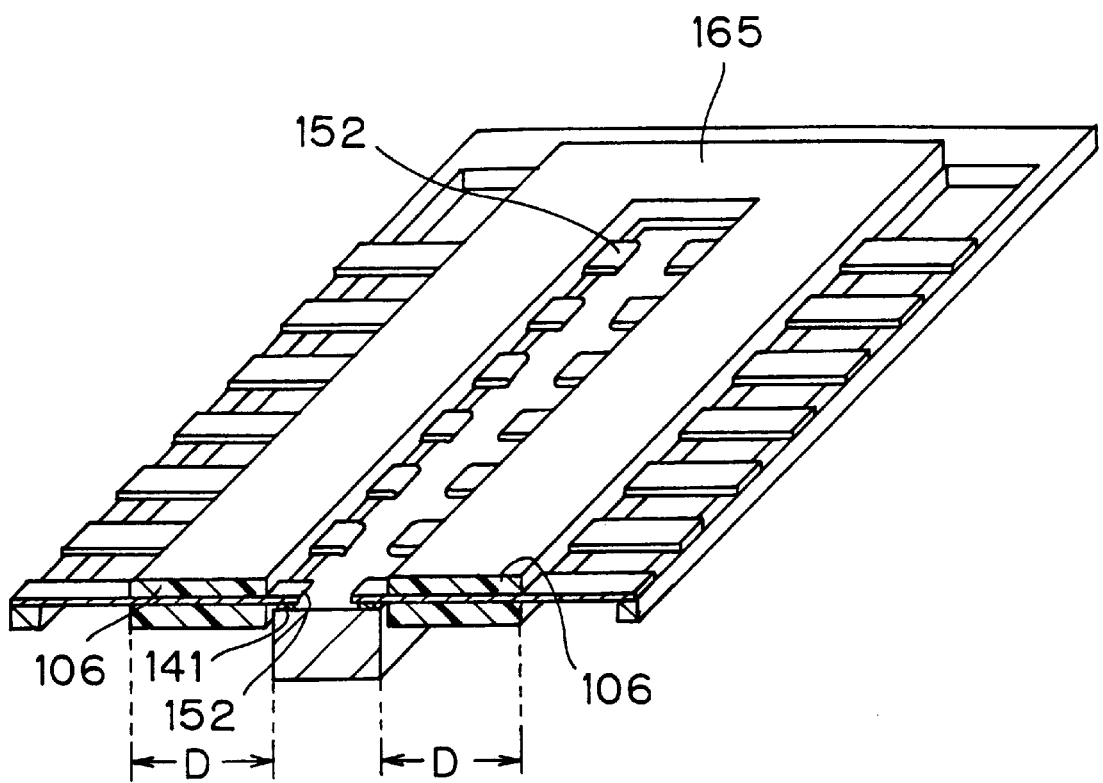
FIG. 4 is a cross-sectional and perspective view similar to FIG. 3 showing a state before carrying out sealing by a potting resin with respect to the conventional slim tape carrier package (TCP).

An insulating film 6 is formed to partially cover a region formed with the group of wirings 5 on the polyimide film board 3 (refer to FIG. 2). The insulating film 6 is made of ultra violet (UV) ray cured resin having solder resistance, insulating performance, heat resistance and so on.

Bands of the insulating film 6 are arranged to continue over whole portions along inner verges of the two slits 31 for terminals on the input side and the output side and whole portions along the two long sides of the slit 32 for the integrated circuit (IC) on the polyimide film board 3.

The insulating film 6 is not arranged at a region interposed by an outer band 61 of the insulating film 6 and an inner band 62 of the insulating film 6. The interposed region is referred to as an insulating-film-omission region 63.

The outer insulating-film band 61, the inner insulating-film band 62 and the insulating-film-omission region 63 surround four peripheries of the slit 32 for the integrated circuit (IC) since they are similarly continued also at portions along two short sides of the polyimide film board 3.

As will be described by an explanation of successive steps, an inner edge of the outer insulating-film band 61 constitutes a levee for damming flow of the potting resin 2. Further, the inner insulating-film band 62 serves as a weir for controlling the flow of the potting resin 2.

The insulating film 6 may be arranged to an area of "the insulating-film-omission region 63". In this case, it is necessary to maintain a sufficient height of stepped portion between the outer insulating-film band 61 or the inner insulating-film band 62 and the insulating-film-omission region 63 to ensure a similar effect.

(3) Mounting of the driver integrated circuit (IC)

The driver integrated circuit (IC) 4 is fitted into the slit 32 for the integrated circuit (IC). Bumps 41 of the driver integrated circuit (IC) and lead portions 52 from the group of wirings are connected by the Au/Sn eutectic bonding (state of FIG. 2).

(4) Sealing by the Potting Resin

The potting resin 2 is poured into, and heated and cured at, the region on and around the bumps 41 of the driver integrated circuit (IC), that is, the region in correspondence with the slit 32 for the integrated circuit (IC) (state of FIG. 1).

The potting resin 2 outputted from a nozzle of a dispenser firstly fills a portion surrounded by the inner insulating-film band 62, successively, overflows from the portion, flows out in all directions and gradually fills the insulating-filmomission region 63. That is, the flow of the potting resin is controlled by the inner insulating-film band 62 functioning as a weir. Accordingly, even when a position of outputting the potting resin is deviated from the center, almost no spreading flow of the potting resin is lopsided into one direction. Therefore, when the polyimide film board 3 is maintained horizontally, the potting resin 2 is supplied from the region of the slit 32 for the integrated circuit (IC) to the insulating-filmomission region 63 considerably uniformly in respect of all directions.

A front end 2a of the potting resin 2 riding over the weir of the inner insulating-film band 62 to wet and spread is dammed by the inner edge of the outer insulating-film band 61. The outer insulating-film band 61 is provided with a sufficient thickness. The potting resin 2 for covering terminals of the driver integrated circuit (IC) and their surroundings readily wets the group of wirings 5 formed of copper but does not easily wet the insulating film 6, in the flowing state before cure.

Even when the potting resin 2 comprising thermosetting resin of epoxy-base resin or the like has high viscosity at the time of outputting from a nozzle, the potting resin 2 has a pertinent degree of cohesion at the time of heat-curing so as to show the flowing and wetting performance mentioned above.

Therefore, so far as an amount of the potting resins 2 is pertinent, the potting resin 2 is not spread to outside by riding over the outer insulating-film band 61. Further, every portion of the group of wirings 5 at inside of the insulating-film-omission region 63 is covered by the potting resin 2 so as to be insulated.

After the potting resin 2 wets and spreads over a total of the insulating-film-omission region 63 in this way, the potting resin 2 is sufficiently heated until the curing is completed.

The tape carrier package (TCP) fabricated as mentioned above is mounted and connected to an edge portion of a flat-panel display apparatus.

According to the embodiment, the thickness of the insulating film 6 is, for example, 25 $\mu$m. When the thickness of the insulating film 6 is equal to or larger than 20 $\mu$m, it is a sufficient thickness for serving as a levee or a weir for damming the potting resin 2.

The length of the slim tape carrier package (TCP) 1 is 20 through 40 mm, further typically, 20 through 30 mm when it is used in a flat-panel display apparatus for portable use. Further, a ratio of width to length is normally equal to or smaller than ¼, typically, equal to or smaller than ⅕. However, when TCP is mounted to an apparatus by being folded, the width naturally increases.

Further, the length of the driver (IC) 4 is 15 mm through 30 mm and the width is 0.5 through 5 mm or equal to or smaller than 1 mm and the length is at least 10 times, further, 15 times or more as much as the width.

According to the slim tape carrier package (TCP) 1 provided by the embodiment, a distance from the driver integrated circuit (IC) 4 to the slit 31 for terminals can normally be made 1.4 times as much as or smaller than the width of the driver integrated circuit (IC) 4, further, equivalent to or lower than the width of the driver integrated circuit (IC).

A specific example will be shown below in respect of dimensions and a kind of cured resin concerning the above-described slim tape carrier package (TCP) 1.

SPECIFIC EXAMPLE

The slim tape carrier package (TCP) 1 is mounted to a signal line drive side (X side) of a thin film transistor (TFT) type liquid crystal display (LCD) apparatus having a wide screen of 16:9 of a diagonal 7 inches size for mounting on a vehicle. For example, six of the slim tape carrier packages (TCP's) 1 are arranged on the X side.

Dimensions of the driver integrated circuit (IC) 4 is 17.5 mm in length and 0.8 mm in width, where a digital image signal is subjected to series to parallel conversion based on a horizontal start signal (STH) and a horizontal clock signal (CKH) both inputted from outside and is outputted after digital to analog conversion. Further, the length of the slim tape carrier package (TCP) 1, that is, a dimension of the tape carrier package (TCP) 1 along an edge of flat-panel display apparatus is 23.6 mm. Further, the width of the slim tape carrier package (TCP) 1 is 9.36 mm, the width of the slit 31 for terminals is 1.2 mm and the width of the insulating-film-omission region 63 is 0.7 mm.

Urethane-base resin is used for forming the insulating film 6 and a coating amount thereof is adjusted to constitute a film thickness of about 25 $\mu$m after drying and curing operation. Epoxy-base resin is used for the potting resin 2 and is completely cured by heating.

According to the specific example, an integrated circuit (IC)/slit interval distance (d) from the driver integrated circuit (IC) 4 to the slit 31 for terminals can be made 1.1 mm. When to design a tape carrier package (TCP) having no insulating-film-omission region 63 and having other constructions totally the same with that of the specific example, the integrated circuit (IC)/slit interval distance (d) needs to be no less than 1.5 mm. That is, the design value of the integrated circuit (IC)/slit interval distance (d) can be made smaller by 0.4 mm or more.

Therefore, according to the above-described embodiment, when the width of the slit 31 is given, the design dimension in the width direction of the slim tape carrier package (TCP) can be made significantly small. When the width of the slim tape carrier package (TCP) is given, the width of the slit 31 for terminals can sufficiently be made large and the connection reliability can sufficiently be enhanced.

In the above-described embodiment, the inner insulating-film band 62 can be omitted.

In the above-described embodiment, the step (the stepped portion) between the region covered by the insulating film and the region in which no insulating film is formed, serves as a levee for damming the integrated circuit (IC) insulating resin from flowing to outside or spreading outside. However, the above-described portion serving as a levee or a weir can be installed also by screen printing on an insulating film that covers a total of the group of wirings.

Further, the portion can be installed also by pasting a self adhesive tape having a narrow width.

What is claimed is:

1. A tape carrier package comprising:
    a flexible insulating board;
    a driver integrated circuit is substantially in a rectangular shape, is arranged on said flexible insulating board, and includes a group of terminals for providing an output signal by controlling an input signal with a predetermined timing;
    a group of wirings is electrically connected said group of terminals of said driver integrated circuit and extends to outer sides of said flexible insulating board;
    an insulating film pattern is arranged on said group of wirings to form a stepped portion, having a levee shape, said stepped portion for surrounding said driver integrated circuit at a distance from said driver integrated circuit step along the driver IC; and a sealing resin, which seals said group of terminals of said driver integrated circuit and which covers a region between said stepped portion and said group of terminals of said driver integrated circuit.

2. The tape carrier package according to claim 1:
   wherein the insulating film pattern includes an opening along the driver IC.

3. The tape carrier package according to claim 1:
   wherein a length of the driver IC is 10 times or more as long as a width thereof.

4. The tape carrier package according to claim 1:
   wherein the driver IC is used in a TFT type liquid crystal display apparatus.

5. The tape carrier package according to claim 1:
   wherein a width of the driver IC is equal to or smaller than 1 mm.

6. The tape carrier package according to claim 1, wherein a height of said stepped portion of said insulating film pattern is any one of equal to 20 $\mu$m and larger than 20 $\mu$m.

7. The tape carrier package according to claim 2:
   wherein a film thickness of the insulating film pattern is equal to or larger than 20 $\mu$m.

8. A method of fabricating a tape carrier package comprising the steps of:
   providing a flexible insulating board;
   forming a group of wirings on said flexible insulating board, wherein said group of wirings is extended to outer sides of said flexible insulating board;
   mounting a driver integrated circuit onto said flexible insulating board, wherein said driver integrated circuit is substantially rectangular in shape and includes a group of terminals for providing an output signal by controlling an input signal with a predetermined timing, and wherein said mounting of said driver integrated circuit is for electrically connecting said group of wirings to said group of terminals; and
   sealing said group of terminals of said driver integrated circuit by a sealing resin, wherein said sealing of said group of terminals is performed after an insulating film pattern is arranged on said group of wirings for forming a stepped portion so that said driver integrated circuit is surrounded by said insulating film pattern at a distance from said driver integrated circuit and said sealing resin covers a region between said stepped portion and said group of terminals of said driver integrated circuit.

9. The tape carrier package according to claim 2, wherein said insulating film pattern also forms a weir-shaped raised portion surrounding said driver integrated circuit at an inside of said stepped portion, said weir-shaped raised portion being a second insulator-film band and wherein said opening is a region between said stepped portion and said weir-shaped raised portion, said region being solely covered by said sealing resin.

10. The tape carrier package according to claim 1, wherein said stepped portion is an inner verge of a band of an insulator film, said band of said insulator film being a first insulator-film band.

* * * * *